United States Patent
Hatano et al.

(10) Patent No.: US 12,327,744 B2
(45) Date of Patent: Jun. 10, 2025

(54) SUBSTRATE TRANSFER DEVICE AND SUBSTRATE PROCESSING SYSTEM

(71) Applicant: Tokyo Electron Limited, Tokyo (JP)

(72) Inventors: Tatsuo Hatano, Nirasaki (JP); Tetsuya Miyashita, Nirasaki (JP); Naoki Watanabe, Nirasaki (JP); Naoyuki Suzuki, Fuchu (JP)

(73) Assignee: Tokyo Electron Limited, Tokyo (JP)

( * ) Notice: Subject to any disclaimer, the term of this patent is extended or adjusted under 35 U.S.C. 154(b) by 348 days.

(21) Appl. No.: 17/756,217

(22) PCT Filed: Nov. 20, 2020

(86) PCT No.: PCT/JP2020/043457
§ 371 (c)(1),
(2) Date: May 19, 2022

(87) PCT Pub. No.: WO2021/106799
PCT Pub. Date: Jun. 3, 2021

(65) Prior Publication Data
US 2022/0415687 A1    Dec. 29, 2022

(30) Foreign Application Priority Data
Nov. 29, 2019    (JP) .................. 2019-217077

(51) Int. Cl.
*H01L 21/677*    (2006.01)
*B65G 54/02*    (2006.01)
*H02K 41/03*    (2006.01)

(52) U.S. Cl.
CPC ........ *H01L 21/67709* (2013.01); *B65G 54/02* (2013.01); *H01L 21/67748* (2013.01); *H02K 41/031* (2013.01); *H02K 2201/18* (2013.01)

(58) Field of Classification Search
CPC ............. B65G 54/02; H01L 21/67709; H01L 21/67748; H02K 41/031; H02K 2201/18; G03F 7/7075
See application file for complete search history.

(56) References Cited

U.S. PATENT DOCUMENTS

| 5,180,048 A | * | 1/1993 | Kawada | ............ H01L 21/67709 104/282 |
| 5,196,745 A | * | 3/1993 | Trumper | ............. G03F 7/70716 318/135 |
| 6,206,176 B1 | * | 3/2001 | Blonigan | .......... H01L 21/67709 414/217 |

(Continued)

FOREIGN PATENT DOCUMENTS

| JP | 2017-168866 A | | 9/2017 | |
| JP | 2018-504784 A | | 2/2018 | |
| KR | 20130063901 A | * | 6/2013 | ....... H01L 21/67709 |

*Primary Examiner* — James Keenan
(74) *Attorney, Agent, or Firm* — Armstrong Teasdale LLP (57) ABSTRACT

A substrate transfer device, includes: a first planar motor installed in a first chamber and having an array of coils; a second planar motor installed in a second chamber connected to the first chamber and having an array of coils; a pair of transfer units configured to move on at least one of the first planar motor and the second planar motor and configured to transfer a substrate; and a controller configured to control supply of electric current to the coils of the first planar motor and the second planar motor.

13 Claims, 11 Drawing Sheets

(56) References Cited

U.S. PATENT DOCUMENTS

| | | | | |
|---|---|---|---|---|
| 9,327,855 | B2* | 5/2016 | Hurni | B65G 54/02 |
| 9,463,591 | B2* | 10/2016 | Winzinger | B65G 29/00 |
| 9,828,192 | B2* | 11/2017 | Baechle | H02K 41/031 |
| 10,056,279 | B2* | 8/2018 | Janakiraman | H01L 21/67709 |
| 10,483,141 | B2* | 11/2019 | Janakiraman | H01L 21/67709 |
| 11,097,908 | B2* | 8/2021 | Tanaka | B65G 43/10 |
| 11,542,105 | B2* | 1/2023 | Mezzaro | B65B 43/52 |
| 2010/0157276 | A1 | 6/2010 | Shibazaki | |
| 2013/0109189 | A1* | 5/2013 | Cho | H01L 31/18 |
| | | | | 156/345.31 |
| 2023/0377927 | A1* | 11/2023 | Hatano | H01L 21/67742 |

\* cited by examiner

SUBSTRATE TRANSFER DEVICE AND SUBSTRATE PROCESSING SYSTEM

CROSS-REFERENCE TO RELATED APPLICATIONS

The present application is a U.S. National Stage Entry of International Patent Application No. PCT/JP2020/043457, filed Nov. 20, 2020, which claims the benefit of priority to Japanese Patent Application No. 2019-217077, filed Nov. 29, 2019, each of which is hereby incorporated herein by reference in its entirety.

TECHNICAL FIELD

The present disclosure relates to a substrate transfer device and a substrate processing system.

BACKGROUND

For example, there is known a substrate processing system including processing chambers and a vacuum transfer chamber connected to the processing chambers. A substrate transfer device for transferring a substrate is provided in the vacuum transfer chamber.

Patent Document 1 discloses a processing station including processing modules and a transfer module. The transfer module is provided with a wafer transfer mechanism composed of an articulated arm.

Further, Patent Document 2 discloses a semiconductor processing facility for transferring a substrate by using a planar motor.

PRIOR ART DOCUMENTS

Patent Documents

Patent Document 1: Japanese laid-open publication No. 2017-168866
Patent Document 2: Japanese laid-open publication No. 2018-504784

In the processing station disclosed in Patent Document 1, articulated arms are provided in the transfer module having a vacuum atmosphere in order to transfer a substrate to processing modules. Motors that may serve as sources of dust are arranged outside the transfer module, the rotary shaft of the articulated arm is arranged to pass through the bottom surface of the transfer module, and the gap between the bottom surface and the rotary shaft is sealed by a magnetic seal. Therefore, there is a problem that it is difficult to keep the inside of the transfer module in a high vacuum. In addition, the system disclosed in Patent Document 2 has a problem that it is difficult to handle and it is necessary to widen the opening of the chamber.

The present disclosure provides some embodiments of a substrate transfer device for transferring a substrate.

SUMMARY

According to one embodiment of the present disclosure, there is provided a substrate transfer device, including: a first planar motor installed in a first chamber and having an array of coils; a second planar motor installed in a second chamber connected to the first chamber and having an array of coils; a pair of transfer units configured to move on the first planar motor and/or the second planar motor and configured to transfer a substrate; and a controller configured to control supply of electric current to the coils of the first planar motor and the second planar motor.

According to the present disclosure, it is possible to provide a substrate transfer device for transferring a substrate.

DETAILED DESCRIPTION

Embodiments of the present disclosure will now be described in detail with reference to the accompanying drawings. In each drawing, the same components are designated by like reference numerals and duplicate explanations thereof may be omitted.

<Substrate Processing System 100>

Figure 1:
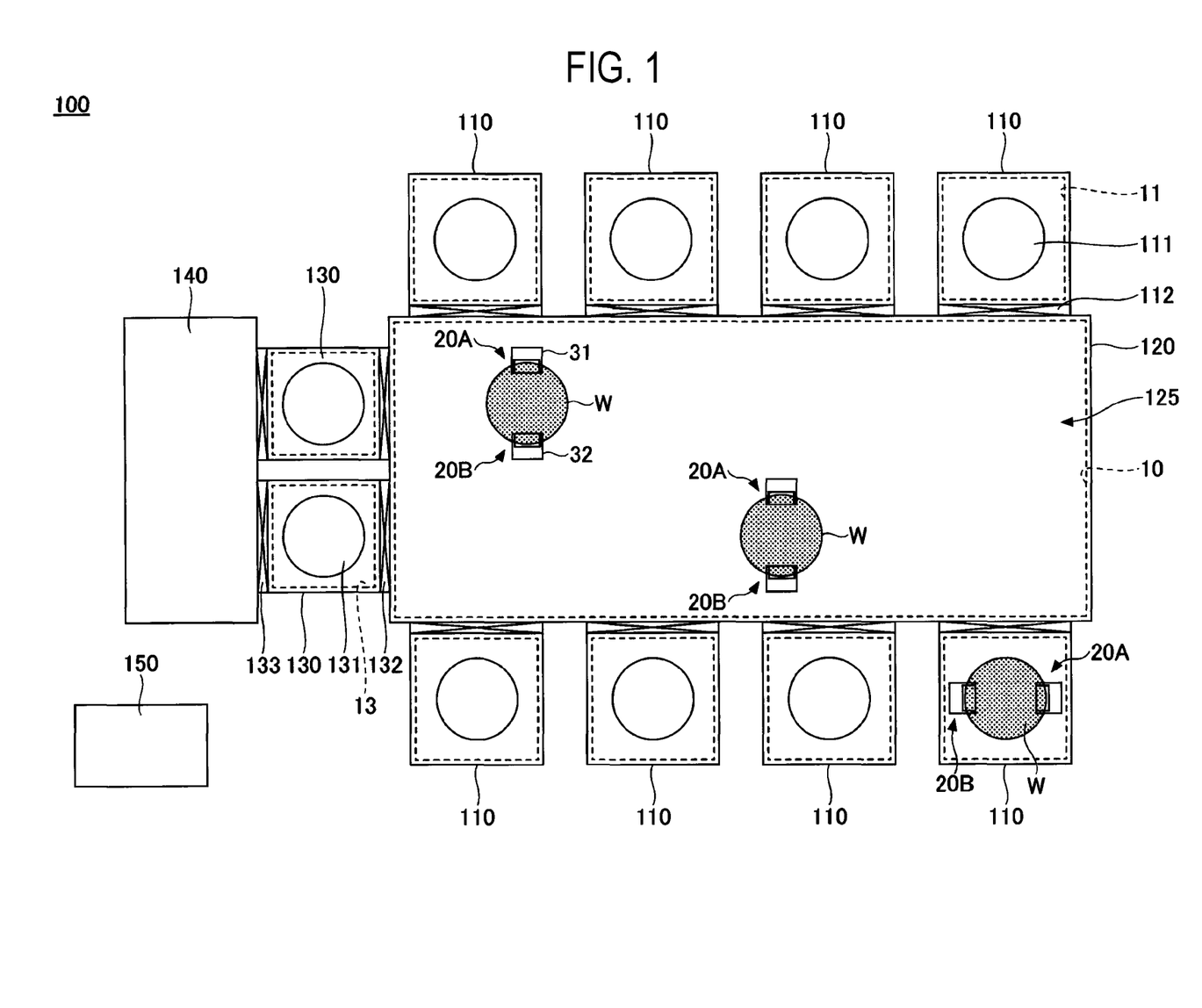
FIG. 1 is a plan view showing a configuration of an example of a substrate processing system according to an embodiment.

An example of the overall configuration of a substrate processing system 100 according to an embodiment will be described with reference to FIG. 1. FIG. 1 is a plan view showing a configuration of an example of a substrate processing system 100 according to an embodiment. In FIG. 1, the wafer W is indicated by dot hatching.

The substrate processing system 100 shown in FIG. 1 is a system having a cluster structure (multi-chamber type). The substrate processing system 100 includes processing chambers 110, a vacuum transfer chamber 120, a load lock chamber 130, an air transfer chamber 140, and a controller 150.

The processing chamber 110 is depressurized to a predetermined vacuum atmosphere. Inside the processing chamber 110, a desired process (an etching process, a film forming process, a cleaning process, an ashing process, etc.)

is performed on a semiconductor wafer W (hereinafter also referred to as "wafer W"). The processing chamber 110 is arranged adjacent to the vacuum transfer chamber 120. The processing chamber 110 and the vacuum transfer chamber 120 are brought into communication with each other by opening and closing a gate valve 112. The processing chamber 110 includes a stage 111 on which the wafer W is mounted. In addition, a planar motor 11 of the substrate transfer device 125 for transferring the wafer W is provided inside the processing chamber 110. The operation of each part for processing in the processing chamber 110 is controlled by the controller 150.

The vacuum transfer chamber 120 is depressurized to a predetermined vacuum atmosphere. Further, a planar motor 10 of the substrate transfer device 125 for transferring the wafer W is provided inside the vacuum transfer chamber 120. The substrate transfer device 125 has a transfer unit 20 that holds the wafer W. The substrate transfer device 125 loads and unloads the wafer W between the processing chamber 110 and the vacuum transfer chamber 120 according to the opening and closing of the gate valve 112. Further, the substrate transfer device 125 loads and unloads the wafer W between the load lock chamber 130 and the vacuum transfer chamber 120 according to the opening and closing of the gate valve 132. The operation of the substrate transfer device 125 and the opening and closing of the gate valve 112 are controlled by the controller 150. The substrate transfer device 125 will be described later with reference to FIGS. 2 and 3A to 3B.

The load lock chamber 130 is provided between the vacuum transfer chamber 120 and the air transfer chamber 140. The load lock chamber 130 includes a stage 131 on which the wafer W is mounted. Further, a planar motor 13 of the substrate transfer device 125 for transferring the wafer W is provided inside the load lock chamber 130. The load lock chamber 130 is configured to switch between an air atmosphere and a vacuum atmosphere. The load lock chamber 130 and the vacuum transfer chamber 120 having the vacuum atmosphere are brought into communication with each other by opening and closing the gate valve 132. The load lock chamber 130 and the air transfer chamber 140 having the air atmosphere are brought into communication with each other by opening and closing the gate valve 133. The switching between the vacuum atmosphere and the air atmosphere in the load lock chamber 130 is controlled by the controller 150.

The air transfer chamber 140 has an air atmosphere. For example, a downflow of clean air is formed in the air transfer chamber 140. Further, a transfer device (not shown) for transferring the wafer W is provided inside the air transfer chamber 140. The transfer device (not shown) loads and unloads the wafer W between the load lock chamber 130 and the air transfer chamber 140 according to the opening and closing of the gate valve 133. The operation of the transfer device (not shown) and the opening and closing of the gate valve 133 are controlled by the controller 150.

Further, a load port (not shown) is provided on the wall surface of the air transfer chamber 140. A carrier (not shown) accommodating wafers W or an empty carrier is attached to the load port. As the carrier, for example, an FOUP (Front Opening Unified Pod) or the like may be used.

The transfer device (not shown) can remove the wafer W accommodated in the load port and can mount the wafer W on the stage 131 of the load lock chamber 130. Further, the transfer device (not shown) can remove the wafer W mounted on the stage 131 of the load lock chamber 130 and accommodate the wafer W in the load port.

The controller 150 includes a CPU (Central Processing Unit), a ROM (Read Only Memory), a RAM (Random Access Memory), and an HDD (Hard Disk Drive). The controller 150 is not limited to the HDD and may have another storage area such as an SSD (Solid State Drive) or the like. A recipe in which a process procedure, a process condition and a transfer condition are set is stored in the computer readable storage area of the HDD, the RAM or the like.

The CPU controls the processing of the wafer W in each processing chamber 110 according to the recipe and controls the transfer of the wafer W. The HDD or the RAM may store a program for executing the processing of the wafer W in each processing chamber 110 and the transfer of the wafer W. The program may be stored in a storage medium and may be provided from an external device via a network.

Next, an example of the operation of the substrate processing system 100 will be described. Here, as an example of the operation of the substrate processing system 100, description will be made on an operation in which the wafer W accommodated in the carrier attached to the load port is processed in the processing chamber 110 and is accommodated in an empty carrier attached to the load port. At the start of the operation, the gate valves 112, 132 and 133 are closed, and the inside of the load lock chamber 130 is kept in an air atmosphere.

The controller 150 opens the gate valve 133. The controller 150 controls the transfer device in the air transfer chamber 140 to remove the wafer W from the carrier of the load port and mount the wafer W on the stage 131 of the load lock chamber 130. When the wafer W is mounted on the stage 131 of the load lock chamber 130 and the transfer device retracts from the load lock chamber 130, the controller 150 closes the gate valve 133.

The controller 150 controls the exhaust device (not shown) of the load lock chamber 130 to exhaust the air in the chamber and switches the load lock chamber 130 from the air atmosphere to the vacuum atmosphere.

Next, the wafer W mounted on the stage 131 of the load lock chamber 130 is transferred to the processing chamber 110 and mounted on the stage 111. Specifically, the controller 150 opens the gate valve 132. The controller 150 controls a substrate transfer device 125 described later to insert the transfer unit 20 into the load lock chamber 130 up to a preset teaching point, so that the transfer unit 20 holds the wafer W mounted on the stage 131 of the load lock chamber 130 and transfers the wafer W to the vacuum transfer chamber 120. When the transfer unit 20 retracts from the load lock chamber 130, the controller 150 closes the gate valve 132.

The controller 150 opens the gate valve 112 of the processing chamber 110 which is the transfer destination. The controller 150 controls the substrate transfer device 125 to insert the transfer unit 20 into the processing chamber 110 up to a preset teaching point, such that the wafer W held by the transfer unit 20 is mounted on the stage 111 of the processing chamber 110. When the transfer unit 20 retracts from the processing chamber 110, the controller 150 closes the gate valve 112.

The controller 150 controls the processing chamber 110 to perform a desired process on the wafer W.

When the processing of the wafer W is completed, the wafer W mounted on the stage 111 of the processing chamber 110 is transferred to the load lock chamber 130 and is mounted on the stage 131. Specifically, the controller 150 opens the gate valve 112. The controller 150 controls the substrate transfer device 125 to insert the transfer unit 20 into the processing chamber 110 up to a preset teaching point, so that the transfer unit 20 holds the wafer W mounted on the stage 111 of the processing chamber 110 and transfers the wafer W to the vacuum transfer chamber 120. When the transfer unit 20 retracts from the processing chamber 110, the controller 150 closes the gate valve 112.

The controller 150 opens the gate valve 132. The controller 150 controls the substrate transfer device 125 to insert the transfer unit 20 into the load lock chamber 130 up to a preset teaching point, so that the transfer unit 20 mounts the wafer W on the stage 131 of the load lock chamber 130. When the transfer unit 20 retracts from the load lock chamber 130, the controller 150 closes the gate valve 132.

The controller 150 controls an intake device (not shown) of the load lock chamber 130 to supply, for example, a clean air to the chamber and switches the load lock chamber 130 from a vacuum atmosphere to an air atmosphere.

The controller 150 opens the gate valve 133. The controller 150 controls a transfer device (not shown) to remove the wafer W mounted on the stage 131 of the load lock chamber 130 and accommodate the wafer W in the carrier of the load port. When the wafer W is taken out from the stage 131 of the load lock chamber 130 and the transfer device (not shown) retracts from the load lock chamber 130, the controller 150 closes the gate valve 133.

In the substrate processing system 100, as described above, the substrate transfer device 125 transfers the wafer W mounted on the stage 131 of the load lock chamber 130 to the stage 111 of the processing chamber 110 and transfers the processed wafer W from the stage 111 of the processing chamber 110 to the stage 131 of the load lock chamber 130. However, the present disclosure is not limited to thereto. The substrate transfer device 125 may be configured to transfer the wafer W mounted on the stage 111 of one processing chamber 110 to the stage 111 of the other processing chamber 110.

<Substrate Transfer Device 125>

Next, the substrate transfer device 125 will be further described. The substrate transfer device 125 includes a planar motor (linear unit) 10 arranged in the vacuum transfer chamber 120, a planar motor 11 arranged in the processing chamber 110, a planar motor 13 arranged in the load lock chamber 130, and a pair of transfer units 20A and 20B capable of moving over the planar motors 10, 11 and 13. Each of the transfer units 20A and 20B includes bases 31 and 32, respectively. There may be provided a plurality of transfer units 20.

Figure 2:
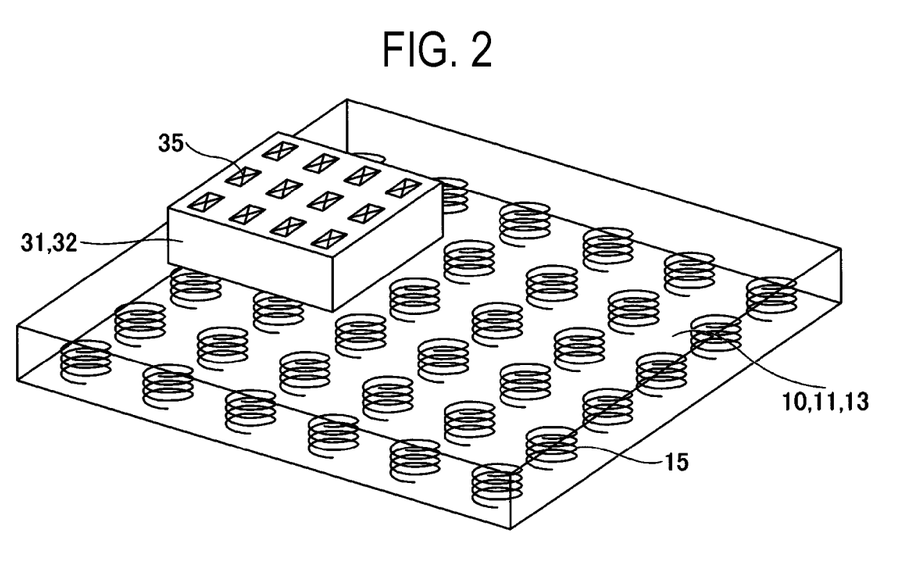
FIG. 2 is a perspective view illustrating the driving principle of a substrate transfer mechanism.

The planar motors 10, 11 and 13 and the bases 31 and 32 of the transfer unit 20 will be further described with reference to FIG. 2. FIG. 2 is a perspective view illustrating the driving principle of the substrate transfer device 125.

Coils 15 are arranged in the planar motors 10, 11 and 13. The coils 15 are configured to generate a magnetic field by being supplied with an electric current. The controller 150 (see FIG. 1) is configured to individually control the current value of the electric current supplied to each coil 15.

Permanent magnets 35 are arranged on the bases 31 and 32. The magnetic fields generated by the coils 15 cause the bases 31 and 32 to magnetically levitate on the planar motors 10, 11 and 13. Further, the permanent magnets 35 receive a pulling force or a repulsive force by the magnetic fields generated by the coils 15, so that the bases 31 and 32 move over the planar motors 10, 11 and 13.

With such a configuration, the controller 150 (see FIG. 1) is configured to control the positions, orientations, and levitation amounts of the bases 31 and 32 by controlling the current values of the coils 15 of the planar motors 10, 11 and 13.

Figure 3A:
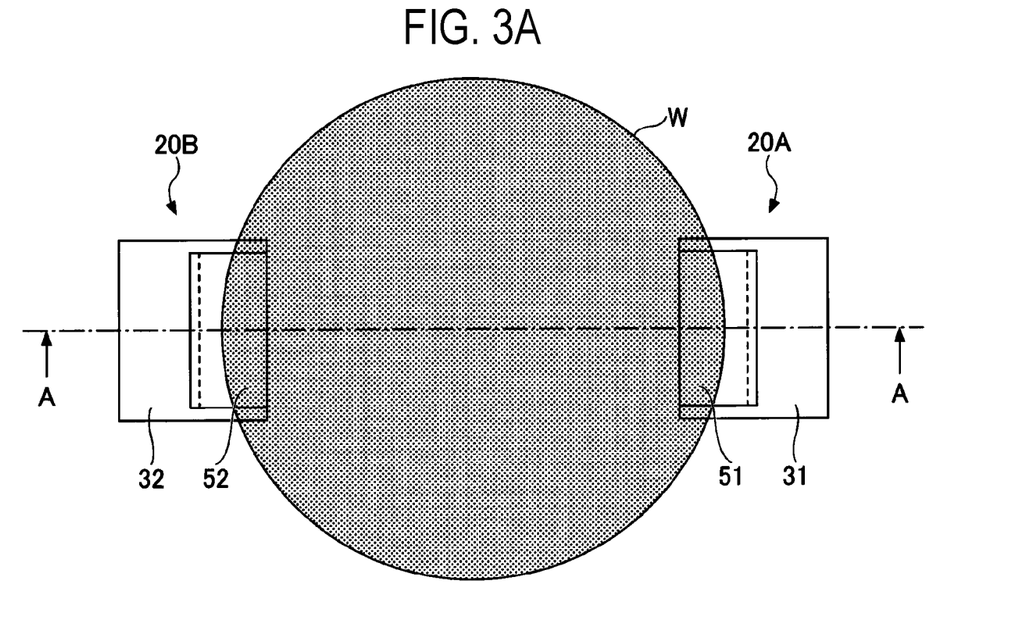
FIG. 3A is a plan view showing an example of a transfer unit according to an embodiment.
Figure 3B:
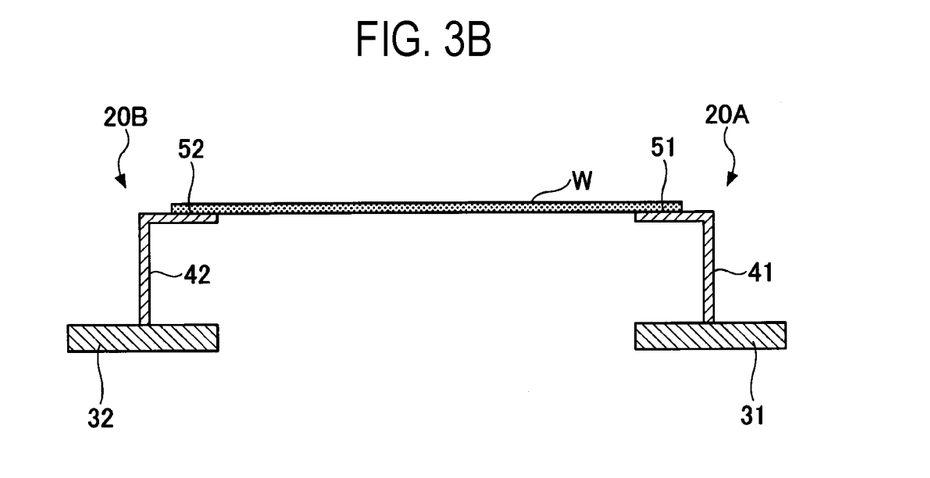
FIG. 3B is a plan view showing an example of the transport unit according to an embodiment.

FIGS. 3A and 3B are views showing an example of the transfer unit 20 according to the embodiment. FIG. 3A is a plan view showing an example of the transfer unit 20. FIG. 3B is a sectional view taken along line A-A, showing an example of the transfer unit 20.

The substrate transfer device 125 transfers the wafer W by using the pair of transfer units 20A and 20B. One transfer unit 20A includes a base 31, a support portion 41, and a substrate support portion 51. The other transfer unit 20B includes a base 32, a support portion 42, and a substrate support portion 52.

In the transfer unit 20A, the support portion 41 is erected from the center of the base 31. The substrate support portion 51 is formed on the support portion 41. As shown in FIGS. 3A and 3B, the support portion 41 and the substrate support portion 51 are shown as being formed at the center in the longitudinal direction of the base 31. However, the present disclosure is not limited thereto. The support portion 41 and the substrate support portion 51 may be provided to be offset to one side.

The one transfer unit 20A and the other transfer unit 20B may have the same shape, may have a mirror image-related symmetric shape, or may have different shapes.

The controller 150 can control the spacing between the substrate support portions 51 and 52 by controlling the spacing between the bases 31 and 32. Further, the controller 150 can transfer the wafer W by moving the bases 31 and 32 while maintaining the relative positional relationship between the bases 31 and 32.

<Delivery of Wafer to the Stage>

Figure 4A:
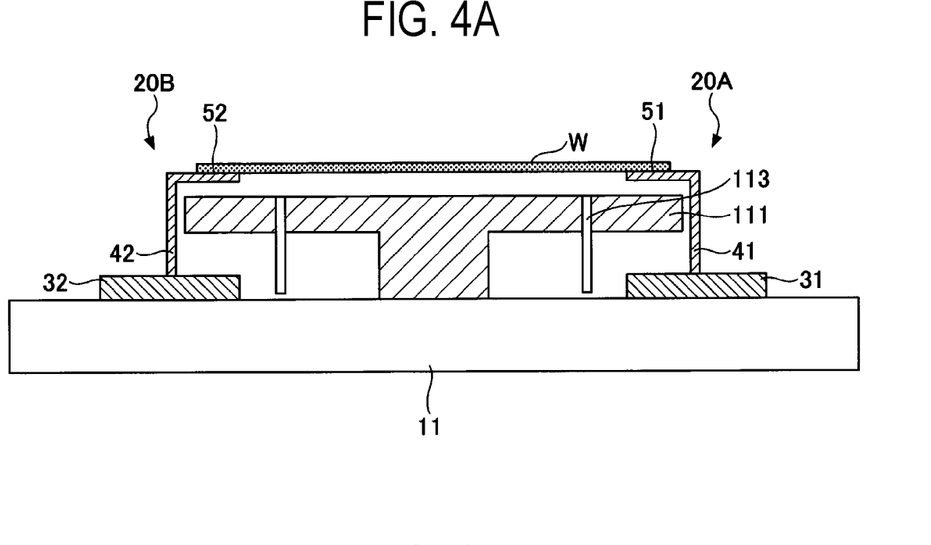
FIG. 4A is a view showing an example of a transfer unit according to an embodiment.
Figure 4B:
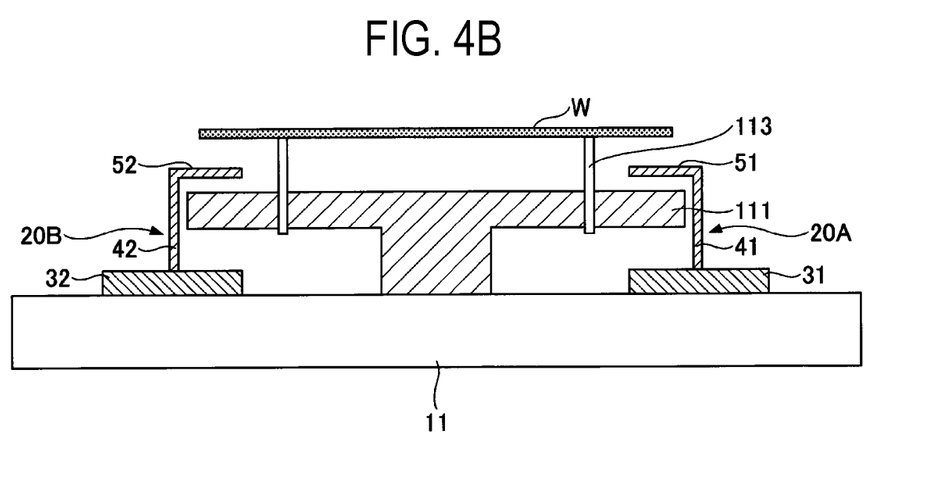
FIG. 4B is a view showing an example of the transfer unit according to an embodiment.
Figure 4C:
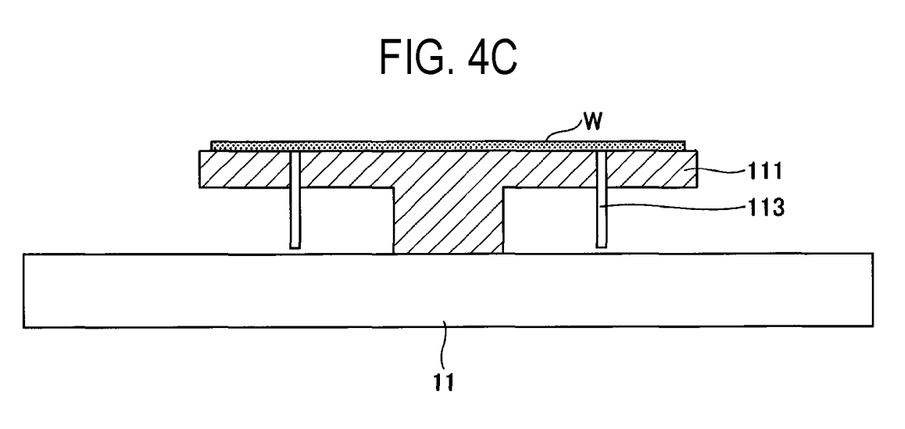
FIG. 4C is a view showing an example of the transfer unit according to an embodiment.

Next, the delivery of the wafer W between the transfer unit 20 and the stage 111 (the stage 131) will be described with reference to FIGS. 4A to 4C. FIGS. 4A to 4C are schematic diagrams illustrating a procedure for mounting the wafer W from the transfer unit 20 to the stage 111 of the processing chamber 110.

As shown in FIG. 3A, in the transfer unit 20, the bases 31 and 32 are spaced apart from each other at a predetermined interval, and the wafer W is supported by the substrate support portions 51 and 52. The transfer unit 20 magnetically levitates and moves over the planar motors 10, 11 and 13 while maintaining the spacing between the bases 31 and 32.

As shown in FIG. 4A, the magnetically levitated bases 31 and 32 are moved over the planar motor 11 to move the wafer W to above the stage 111.

As shown in FIG. 4B, the controller 150 raises the lift pins 113 provided on the stage 111. As a result, the wafer W is lifted by the lift pins 113. Then, the transfer unit 20 moves away from the stage 111 and returns to the vacuum transfer chamber 120.

As shown in FIG. 4C, the controller 150 lowers the lift pins 113 provided on the stage 111. As a result, the wafer W supported by the lift pins 113 is mounted on the stage 111.

The case where the wafer W is delivered from the transfer unit 20 to the stage 111 has been described as an example. When the wafer W is delivered from the stage 111 to the transfer unit 20, the procedure described with reference to FIGS. 4A to 4C is reversely performed. The description thereof will be omitted. Further, although the stage 111 of the processing chamber 110 has been described as an example, the same applies to the stage 131 of the load lock chamber 130, and duplicate description will be omitted.

<Wafer Delivery between Transfer Units>

Figure 5A:
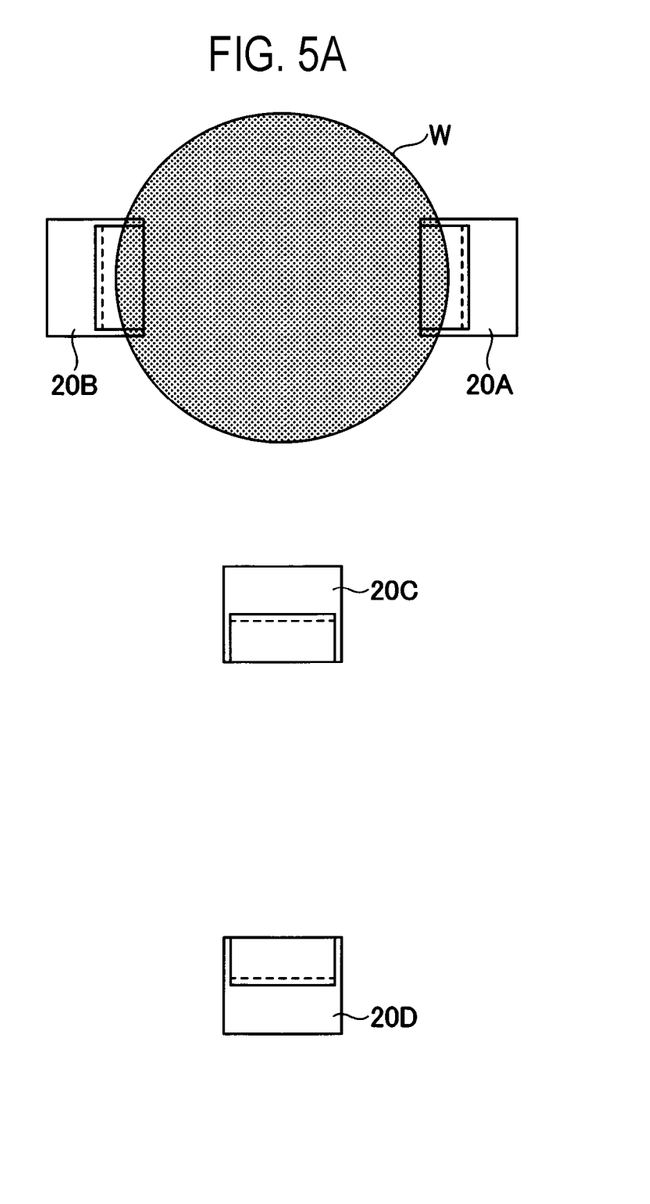
FIG. 5A is a schematic diagram illustrating a procedure for delivering a wafer from one transfer unit to the other transfer unit.
Figure 5B:
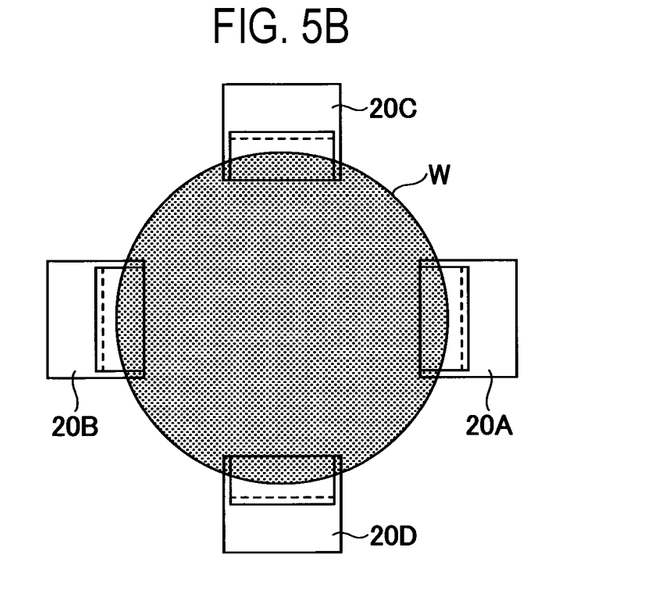
FIG. 5B is a schematic diagram illustrating the procedure for delivering the wafer from one transfer unit to the other transfer unit.
Figure 5C:
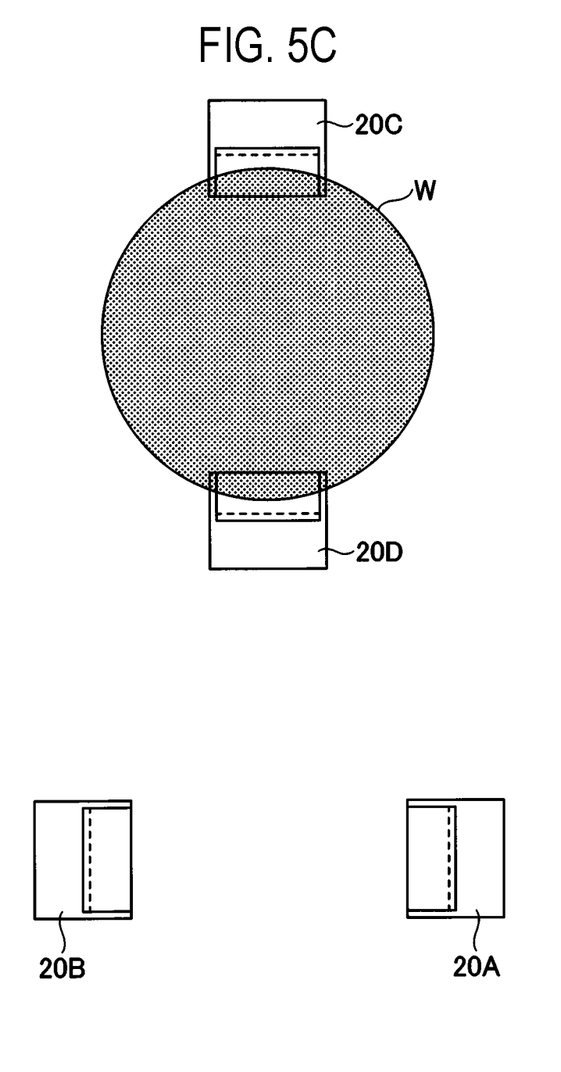
FIG. 5C is a schematic diagram illustrating the procedure for delivering the wafer from one transfer unit to the other transfer unit.

Next, the delivery of the wafer W between one pair of transfer units 20A and 20B and the other pair of transfer units 20C and 20D will be described with reference to FIGS.

5A to 5C. FIGS. 5A to 5C are schematic diagrams illustrating a procedure for transferring the wafer W from one pair of transfer units 20A and 20B to the other pair of transfer units 20C and 20D.

As shown in FIG. 5A, at the start of processing, the wafer W is supported by a pair of transfer units 20A and 20B.

As shown in FIG. 5B, the controller 150 controls the electric current of each coil 15 to move the transfer units 20C and 20D to a receiving position. In the example of FIG. 5B, the transfer units 20C and 20D are moved so that the straight line connecting the transfer units 20A and 20B and the straight line connecting the transfer units 20C and 20D are orthogonal to each other. At this time, the magnetic levitation amount of the transfer units 20A and 20B is higher than the magnetic levitation amount of the transfer units 20C and 20D. Therefore, the wafer W is supported by the substrate support portions 51 and 52 of the transfer units 20A and 20B. Further, the substrate support portions 51 and 52 of the transfer units 20C and 20D can move below the wafer W without contacting the wafer W.

The controller 150 controls the electric current of each coil 15 to make the magnetic levitation amount of the transfer units 20C and 20D relatively larger than the magnetic levitation amount of the transfer units 20A and 20B. As a result, the wafer W is delivered from the transfer units 20A and 20B to the transfer units 20C and 20D.

As shown in FIG. 5C, the controller 150 controls the electric current of each coil 15 to retract the transfer units 20A and 20B from under the wafer W. As a result, the wafer W supported by one pair of transfer units 20A and 20B can be transferred to the other pair of transfer units 20C and 20D.

The spacing between the transfer units 20A and 20B and the spacing between the transfer units 20C and 20D may be different. For example, the spacing between the transfer units 20A and 20B that have received the wafer W from the stage 131 of the load lock chamber 130 is set based on the width of the stage 131. The spacing between the transfer units 20C and 20D for delivering the wafer W to the stage 111 of the processing chamber 110 is set based on the width of the stage 111. As described above, even if the widths of the stages 111 and 131 are different, since the wafer W is delivered between the transfer units 20A and 20B and the transfer units 20C and 20D, the spacing between the transfer units 20 for holding the wafer W can be changed.

<Movement Between Chambers>

Figure 6A:
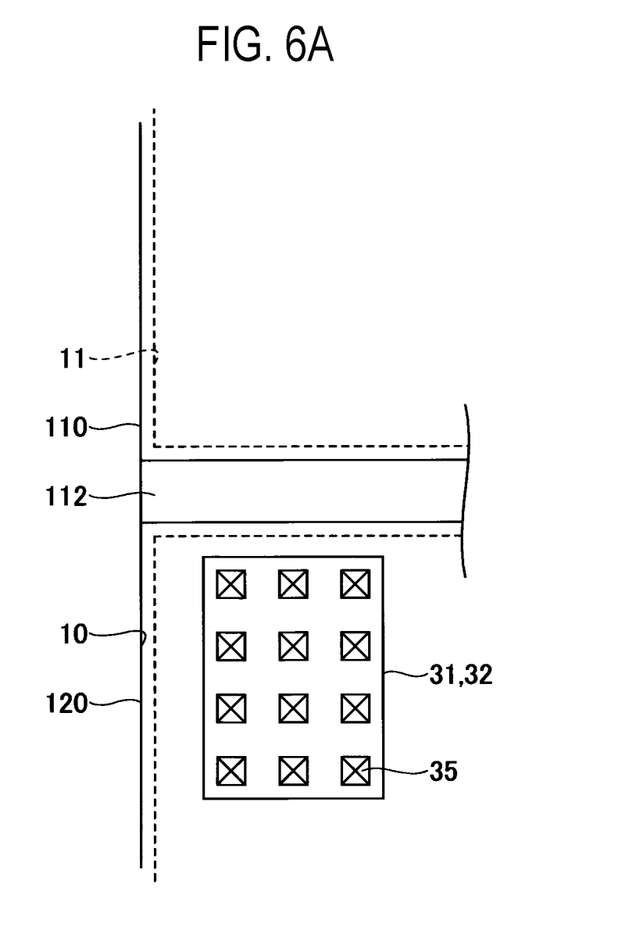
FIG. 6A is a schematic diagram illustrating an operation when a transfer unit is moved from a vacuum transfer chamber to a processing chamber.
Figure 6B:
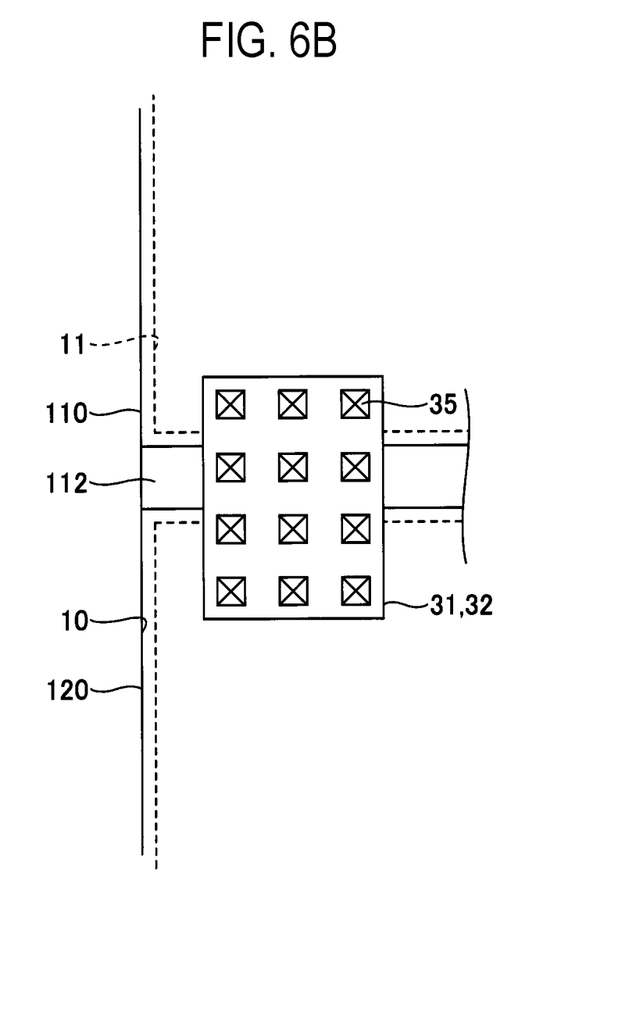
FIG. 6B is a schematic diagram illustrating the operation when the transfer unit is moved from the vacuum transfer chamber to the processing chamber.
Figure 6C:
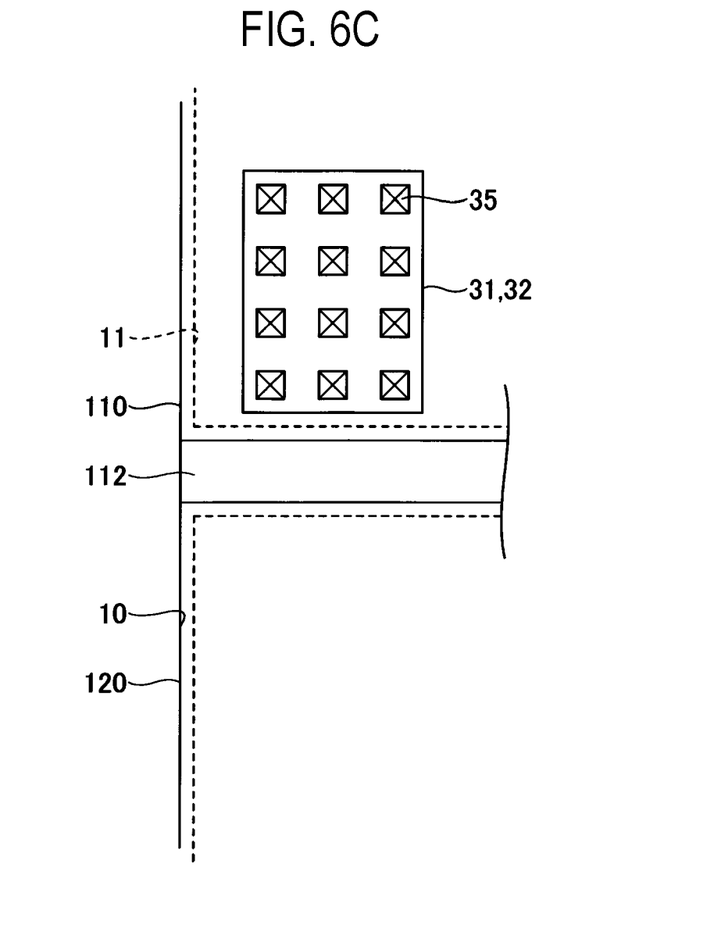
FIG. 6C is a schematic diagram illustrating the operation when the transfer unit is moved from the vacuum transfer chamber to the processing chamber.

Next, the process of moving one pair of transfer units 20A and 20B between two chambers connected via a passage will be described with reference to FIGS. 6A to 6C. FIGS. 6A to 6C are schematic diagrams illustrating an operation when the transfer unit 20 moves from the vacuum transfer chamber 120 to the processing chamber 110.

As shown in FIGS. 6A to 6C, the planar motor 10 is arranged in the vacuum transfer chamber 120, and the planar motor 11 is arranged in the processing chamber 110. Further, a gate valve 112 as a passage is provided between the vacuum transfer chamber 120 and the processing chamber 110. Here, the gate valve 112 is a region in which a planar motor is not provided, that is, a coil 15 is not arranged.

As shown in FIGS. 6A to 6C, the length of the bases 31 and 32 in the traveling direction is set to be larger than the length of the gate valve 112 in the traveling direction. Therefore, as shown in FIGS. 6A to 6C, when the bases 31 and 32 straddle the gate valve 112, at least one of the permanent magnets 35 is arranged on the planar motors 10 and 11. As a result, even when the bases 31 and 32 straddle the gate valve 112, the bases 31 and 32 can be driven by receiving the magnetic fields from the planar motors 10 and 11.

Further, when one of the bases 31 and 32 approaches the gate valve 112, the magnetic fields generated by the planar motor 10 are controlled so that the bases 31 and 32 maintain parallel. Specifically, the magnetic fields are formed so that the repulsive force on the side of the gate valve 112 becomes large. As a result, when the bases 31 and 32 straddle the gate valve 112, it is possible to prevent the bases 31 and 32 from collapsing so that the tip ends of the bases 31 and 32 are lowered.

Although the operation when the transfer unit 20 straddles the gate valve 112 between the processing chamber 110 and the vacuum transfer chamber 120 has been described, the same may be applied to the operation when the transfer unit 20 straddles the gate valve 132 between the load lock chamber 130 and the vacuum transfer chamber 120.

As described above, according to the substrate transfer device 125, the controller 150 can control the positions, orientations, and levitation amounts of the bases 31 and 32 by controlling the electric current supplied to the respective coils 15 of the planar motor 10. This makes it possible to control the position, orientation, and levitation amount of the transfer unit 20.

When the articulated arm is used as the substrate transfer device, a penetration portion and a seal portion through which the rotation axis of the articulated arm penetrates are formed in the vacuum transfer chamber 120. On the other hand, according to the substrate transfer device 125, the penetration portion and the seal portion formed in the vacuum transfer chamber 120 can be eliminated. Therefore, it is possible to increase the degree of vacuum of the vacuum transfer chamber 120. In addition, the transfer unit 20 can suppress dust generation by magnetically levitating and moving on the planar motor 10.

Further, according to the substrate transfer device 125, the wafer W can be freely transferred. This improves the degree of freedom in design in the substrate processing system 100. For example, the space between adjacent processing chambers 110 can be reduced.

Although the substrate processing system 100 has been described above, the present disclosure is not limited to the above-described embodiment and the like. Various modifications and improvements may be made within the scope of the gist of the present disclosure recited in the claims.

The substrate transfer device 125 has been described as being provided in the vacuum transfer chamber 120 having in a vacuum atmosphere. However, the present disclosure is not limited thereto. The substrate transfer device 125 may be applied to the transfer chamber having an air atmosphere.

This application claims priority based on Japanese Patent Application No. 2019-217077 filed on Nov. 29, 2019, the entire contents of which are incorporated herein by reference.

EXPLANATION OF REFERENCE NUMERALS

W: wafer, 100, 100B: substrate processing system, 110: processing chamber (second chamber), 111: stage, 112, 132: gate valve (passage), 120: vacuum transfer chamber (first chamber), 125: substrate transfer device, 130: load lock chamber (second chamber), 150: controller, 10: planar motor, 15: coil, 20, 20A to 20D: transfer unit, 31, 32: base, 35: permanent magnet, 41, 42: support portion, 51, 52: substrate support portion (substrate support member)

What is claimed is:

1. A substrate transfer device, comprising:
a first planar motor installed in a first chamber and having an array of coils;
a second planar motor installed in a second chamber connected to the first chamber and having an array of coils;
at least two pairs of transfer units configured to move on at least one of the first planar motor and the second planar motor, configured to transfer a substrate, and including a first pair of transfer units and a second pair of transfer units; and
a controller configured to control supply of electric current to the coils of the first planar motor and the second planar motor so as to control positions, orientations, and magnetic levitation amounts of the at least two pairs of transfer units, and configured to execute a substrate transfer process,
wherein each pair of the at least two pairs of transfer units is configured to simultaneously support one substrate, and
wherein the substrate transfer process includes transferring the one substrate from the first pair to the second pair by adjusting the magnetic levitation amounts of the first pair and the second pair.

2. The substrate transfer device of claim 1, wherein each of the transfer units includes:
a base having an array of magnets and configured to magnetically levitate on at least one of the first planar motor and the second planar motor; and
a substrate support member installed on the base and configured to support the substrate.

3. The substrate transfer device of claim 2, wherein the controller is configured to move the at least two pairs of transfer units while maintaining a relative positional relationship of the at least two pairs of transfer units.

4. The substrate transfer device of claim 3, wherein the first chamber is a transfer chamber, and the second chamber includes a stage on which the substrate is mounted.

5. The substrate transfer device of claim 4, wherein the second chamber is at least one of a processing chamber and a load lock chamber.

6. The substrate transfer device of claim 1, wherein the first chamber and the second chamber are connected via a passage.

7. The substrate transfer device of claim 6, wherein the passage is a gate valve.

8. The substrate transfer device of claim 1, wherein the controller is configured to move the at least two pairs of transfer units while maintaining a relative positional relationship of the at least two pairs of transfer units.

9. The substrate transfer device of claim 1, wherein the first chamber is a transfer chamber, and the second chamber includes a stage on which the substrate is mounted.

10. The substrate transfer device of claim 1, wherein transferring the one substrate from the first pair to the second pair includes:
moving the second pair below the first pair supporting the one substrate by adjusting the magnetic levitation amount of the second pair to be smaller than the magnetic levitation amount of the first pair;
moving the second pair so that a first straight line connecting the transfer units of the first pair and a second straight line connecting the transfer units of the second pair are orthogonal to each other; and
moving the second pair upward to receive the one substrate from the first pair onto the second pair by adjusting the magnetic levitation amount of the second pair to be larger than the magnetic levitation amount of the first pair.

11. A substrate processing system, comprising:
a substrate transfer device including:
a first planar motor installed in a first chamber and having a first array of coils;
a second planar motor installed in a second chamber connected to the first chamber and having a second array of coils;
at least two pairs of transfer units configured to move on at least one of the first planar motor and the second planar motor, configured to transfer a substrate, and including a first pair of transfer units and a second pair of transfer units; and
a controller configured to control supply of electric current to the coils of the first planar motor and the second planar motor so as to control positions, orientations, and magnetic levitation amounts of the at least two pairs of transfer units, and configured to execute a substrate transfer process;
the first chamber; and
the second chamber,
wherein each pair of the at least two pairs of transfer units is configured to simultaneously support one substrate, and
wherein the substrate transfer process includes transferring the one substrate from the first pair to the second pair by adjusting the magnetic levitation amounts of the first pair and the second pair.

12. The substrate processing system of claim 11, wherein the first chamber is a vacuum transfer chamber having a vacuum atmosphere.

13. The substrate processing system of claim 11, wherein the transferring the one substrate from the first pair to the second pair includes:
moving the second pair below the first pair supporting the one substrate by adjusting the magnetic levitation amount of the second pair to be smaller than the magnetic levitation amount of the first pair;
moving the second pair so that a first straight line connecting the transfer units of the first pair and a second straight line connecting the transfer units of the second pair are orthogonal to each other; and
moving the second pair upward to receive the one substrate from the first pair onto the second pair by adjusting the magnetic levitation amount of the second pair to be larger than the magnetic levitation amount of the first pair.

* * * * *